US 9,269,786 B2

(12) United States Patent
Chou et al.

(10) Patent No.: US 9,269,786 B2
(45) Date of Patent: Feb. 23, 2016

(54) SILICON NITRIDE LAYER DEPOSITED AT LOW TEMPERATURE TO PREVENT GATE DIELECTRIC REGROWTH HIGH-K METAL GATE FIELD EFFECT TRANSISTORS

(71) Applicant: GLOBALFOUNDRIES Inc., Grand Cayman (KY)

(72) Inventors: Anthony I-Chih Chou, Beacon, NY (US); Arvind Kumar, Beacon, NY (US); Shreesh Narasimha, Beacon, NY (US); Claude Ortolland, Peekskill, NY (US); Kai Zhao, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/037,423

(22) Filed: Sep. 26, 2013

(65) Prior Publication Data
US 2015/0084132 A1    Mar. 26, 2015

(51) Int. Cl.
H01L 29/76      (2006.01)
H01L 29/51      (2006.01)
H01L 27/092     (2006.01)
H01L 21/8238    (2006.01)

(52) U.S. Cl.
CPC ...... H01L 29/518 (2013.01); H01L 21/823821 (2013.01); H01L 21/823842 (2013.01); H01L 27/0924 (2013.01); H01L 29/511 (2013.01)

(58) Field of Classification Search
CPC . H01L 29/518; H01L 27/0924; H01L 29/511; H01L 29/1079; H01L 21/823842; H01L 21/823821; H01L 27/008
USPC ........... 257/288, 368, 369; 438/151, 197, 199
See application file for complete search history.

(56) References Cited

U.S. PATENT DOCUMENTS

| 7,217,611 | B2 | 5/2007 | Kavalieros et al. | |
|---|---|---|---|---|
| 8,426,300 | B2 | 4/2013 | Ramachandran et al. | |
| 2007/0048917 | A1* | 3/2007 | Yamamoto | H01L 21/02057 438/197 |
| 2013/0299920 | A1* | 11/2013 | Yin | H01L 29/78 257/408 |
| 2014/0103407 | A1* | 4/2014 | Chang | H01L 21/82847 257/288 |
| 2014/0349452 | A1* | 11/2014 | Wang | H01L 21/823468 438/238 |

OTHER PUBLICATIONS

"Novel Nitrogen Profile Engineering for Improved TaN/HfO2/Si MOSFET Performance", H.-J.Cho, et al., Microelectronics Research Center; IEEE 2001; pp. 30.2.1-30.2.4.
"Improved Thermal Stability and Device Performance of Ultra-thin (EOT<10A) Gate Dielectric MOSFETs by Using Hafnium Oxynitride (HfOxNy)" Kang, et al., Microelectronics Research Center; 2002; pp. 146-147.

* cited by examiner

*Primary Examiner* — Jarrett Stark
*Assistant Examiner* — Shahed Ahmed
(74) *Attorney, Agent, or Firm* — Heslin Rothenberg Farley & Mesiti P.C.

(57) ABSTRACT

Standard High-K metal gate (HKMG) CMOS technologies fabricated using the replacement metal gate (RMG), also known as gate-last, integration flow, are susceptible to oxygen ingress into the high-K gate dielectric layer and oxygen diffusion into the gate dielectric and semiconductor channel region. The oxygen at the gate dielectric and semiconductor channel interface induces unwanted oxide regrowth that results in an effective oxide thickness increase, and transistor threshold voltage shifts, both of which are highly variable and degrade semiconductor chip performance. By introducing silicon nitride deposited at low temperature, after the metal gate formation, the oxygen ingress and gate dielectric regrowth can be avoided, and a high semiconductor chip performance is maintained.

20 Claims, 5 Drawing Sheets

SILICON NITRIDE LAYER DEPOSITED AT LOW TEMPERATURE TO PREVENT GATE DIELECTRIC REGROWTH HIGH-K METAL GATE FIELD EFFECT TRANSISTORS

FIELD OF THE INVENTION

The present invention relates generally to semiconductor device and more specifically High-k Metal Gate (HKMG) Replacement Gate Field Effect Transistors (RMG FETs) for use in CMOS technologies.

BACKGROUND OF THE INVENTION

High-K dielectric with Metal Gate electrodes (HKMG) has been proven to be one of the most critical innovations that allows further gate thickness scaling, which in turn enables the active channel length scaling and the overall performance boost in advanced CMOS technology. Furthermore, the Replacement Gate (RMG) integration flow for HKMG provides additional advantage in terms of thermal budget control. However, in a typical HKMG RMG flow, gate dielectric, including the high-K gate can become exposed after the metal gate CMP process. This can provides an oxygen ingress path and lead to oxide regrowth at gate channel interface during the subsequent Middle of Line (MOL) dielectric deposition and Back End of the Line (BEOL) processing. The oxide regrowth increases the effective dielectric thickness and shifts the transistor threshold voltage, both of which can cause severe device degradation in terms of performance and variability. Thus, the oxygen ingress and regrowth at high-K gate dielectric to semiconductor channel interface should be avoided.

In the prior art, after the metal-gate CMP is completed, the next layer, usually silicon nitride, is typically deposited at temperatures high enough (>500° C.) that the exposed high-K gate dielectric material can absorb any oxygen present during the deposition process, and transport the oxygen towards the gate dielectric to channel interface region, where the oxygen causes an unwanted regrowth. The deposition temperature is important because higher temperatures increase the absorption and diffusion of oxygen into the high-K gate dielectric, towards the gate dielectric to channel interface.

FIGS. 1 to 8 illustrate prior art for High-K Metal Gate (HKMG) Field Effect Transistor (FET), using the Replacement Metal Gate (RMG) integration scheme, also known as Gate-Last integration.

FIG. 1 shows starting with a semiconductor substrate which can be formed of any semiconductor such as silicon, germanium, silicon-germanium or other compound semiconductors, the subsequent structures are built. Shown, is the formation of a sacrificial gate, which is formed by conventional deposition or growth of a sacrificial gate dielectric, such as $SiO_2$ or other suitable dielectric, and deposition of a poly-crystalline or amorphous semiconductor, such as silicon or germanium or any compound semiconductor, followed by standard gate lithography and etching to form gate structures. Also shown is a spacer formed by conventional deposition of silicon nitride or other suitable spacer dielectric and standard anisotropic Reactive Ion Etch (RIE) techniques.

FIG. 2 shows the formation of standard source/drain regions formed by ion implantation of dopants, or embedded source/drain formed by etching a trenched, then refilled by epitaxial deposition of doped semiconductor, such as silicon, silicon-germanium, silicon carbon, or other materials, or a combination of ion implantation and epitaxial source/drain formation. As mentioned previously, the source/drain region can be either n-type for NFET or p-type for PFET devices, which can be achieved by utilizing conventional lithography and patterning techniques.

FIG. 3 shows the deposition of an interlayer dielectric (ILD) such as silicon oxide or other suitable dielectric, which is then planarized by conventional Chemical Mechanical Polishing (CMP). The sacrificial gate is removed by a selective wet or plasma etch that removes the sacrificial gate material but not the ILD, nor the spacer material. The sacrificial gate dielectric can also be removed at the step if desired, or it can be retained and incorporated into the final structure. For the purposes of the description, the sacrificial gate dielectric is removed.

FIG. 4 shows the deposition of a gate dielectric stack which can have a single or multiple layers such as an interface oxide or oxynitride layer and high-K dielectric layers such as hafnium oxide, hafnium silicate or other high-K materials. Also shown is the deposition of a workfunction metal material such as TiN on top of the gate dielectric stack. The purpose of the workfunction metal layer is to set the appropriate workfunction to achieve the desired transistor threshold voltage ($V_{th}$). The workfunction layer can be a single layer or multiple layers. It should be understood that NFET and PFET transistors may require different workfunction metal layers, which can be achieved by conventional lithography and patterning techniques to place n-type workfunction metal layers in NFET transistor regions and p-type workfunction metal layers in PFET transistor regions.

FIG. 5 shows an additional metal gate deposition on top of the workfunction metal to completely fill the gate region. The metal gate material can be W, Al or other suitable metal which provides a low resistance gate contact or stacks of different metals. The metal gate material can be different between NFET and PFET transistors.

FIG. 6 shows the structure after a conventional metal gate CMP process has been performed to planarize the surface to the top of the gate. The CMP process removes the metal gate, workfunction metal and high-K gate dielectric stacks from the top surface of the wafer, leaving those materials only within the gate. Note also, that because of the CMP process, the top periphery of the high-K dielectric is exposed to the ambient environment during subsequent process steps. In particular, if that ambient environment in subsequent process steps contains any oxygen and the temperature is high enough (>500° C.), the exposed top periphery of the high-K dielectric stack will absorb that oxygen and transport it by diffusion to the gate dielectric to semiconductor channel interface, which causes several problems as will be described in a subsequent section.

FIG. 7 shows the deposition of a middle of line (MOL) dielectric such as silicon nitride or oxide or other suitable dielectric material, which is typically deposited by chemical vapor deposition (CVD) or other conventional techniques at a temperature exceeding 500° C. Because the ambient of the deposition process typically contains some oxygen, the oxygen will be absorbed by the exposed top periphery of the high-K dielectric and transported by diffusion to the gate dielectric to semiconductor channel interface, which causes several problems as will be described in a subsequent section.

FIG. 8 shows in additional detail the structure in FIG. 7, and the issues created by the standard replacement metal gate processing in prior art. As described previously, after the metal gate CMP process to planarize and remove the metal gate, workfunction metal and high-K gate dielectric materials from the top surface of the wafer, the top periphery of the high-K gate dielectric is exposed to ambient of the next process step. The next process step is a conventional MOL dielectric deposition of either silicon nitride or oxide or other suitable dielectric material which is performed at a temperature of 500° C. or more. Because the ambient of these deposition processes typically contains some residual oxygen, the oxygen will be absorbed by the exposed top periphery of the high-K dielectric and transported by diffusion to the gate dielectric to semiconductor channel interface. When oxygen diffuses to the gate dielectric to semiconductor channel interface, several problems can occur. First, the oxygen grows additional unwanted oxide at the critical gate dielectric to semiconductor channel interface, which thickens the effective oxide thickness (EOT) of the gate dielectric stack, which reduces transistor performance. Second, the oxygen shifts transistor $V_{th}$ away from the desired $V_{th}$ set point. Third, because the oxygen diffusion and ingress into the gate dielectric to semiconductor channel interface is not well controlled and varies significantly across wafer and from wafer to wafer during processing, both the EOT thickness increase and $V_{th}$ shifts are highly variable, which severely degrades the overall semiconductor chip performance and manufacturability.

Accordingly, there is a need for a structure and method to minimize the oxygen ingress and diffusion into the gate dielectric to semiconductor channel interface in RMG FET structure and process.

BRIEF DESCRIPTION OF THE DRAWINGS

The present invention will be understood and appreciated more fully from the following detailed description of the invention taken in conjunction with the accompanying drawings of which:

FIGS. 1 to 8 illustrate a prior art High-K Metal Gate (HKMG) Field Effect Transistor (FET), using the Replacement Metal Gate (RMG) integration scheme, also known as Gate-Last integration, wherein;

FIG. 1 describes a conventional sacrificial gate and spacer formation;

FIG. 2 shows the formation of a typical source and drain;

FIG. 3 illustrates a prior art formation of an interlayer dielectric followed by a polysilicon open and sacrificial gate removing;

FIG. 4 shows a prior art formation of a gate dielectric stack (High-K) and workfunction metal(s);

FIG. 5 illustrates prior art multiple metal layers using e.g., TiN and W;

FIG. 6 depicts planarization of the top surface preferably by CMP;

FIG. 7 shows the formation of a prior art MOL dielectric (nitride) wherein oxygen is exposed and allowed to ingress;

FIG. 8 illustrates a correction of removing the deficient prior art process and structure, wherein unwanted oxygen ingress and diffusion to the high-K gate dielectric to channel interface region.

SUMMARY OF THE INVENTION

Figure 1:
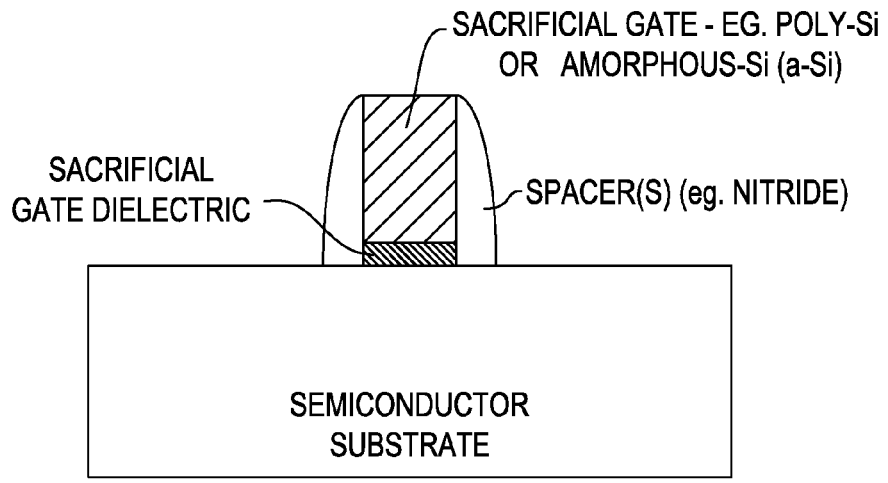
Figure 2:
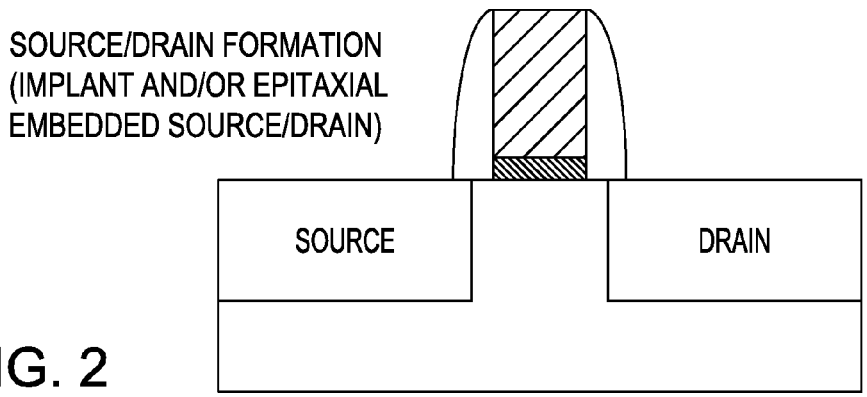
Figure 3:
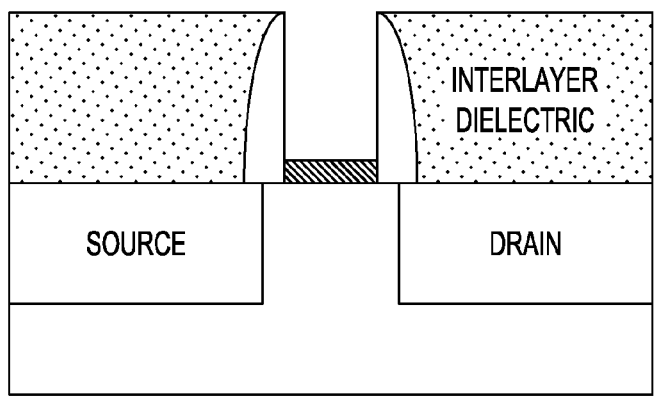
Figure 4:
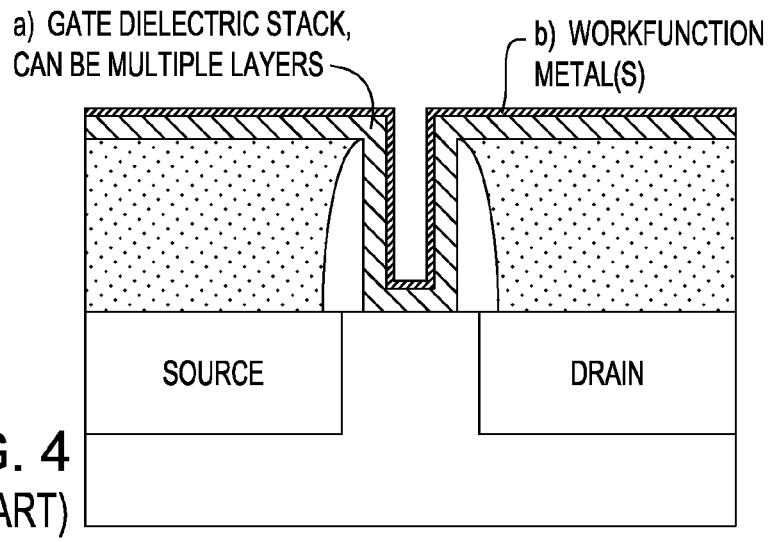
Figure 5:
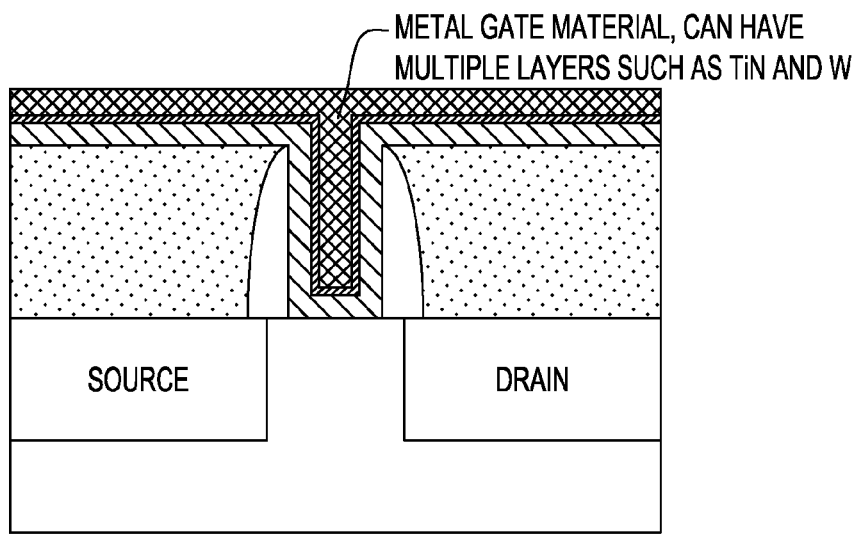
Figure 6:
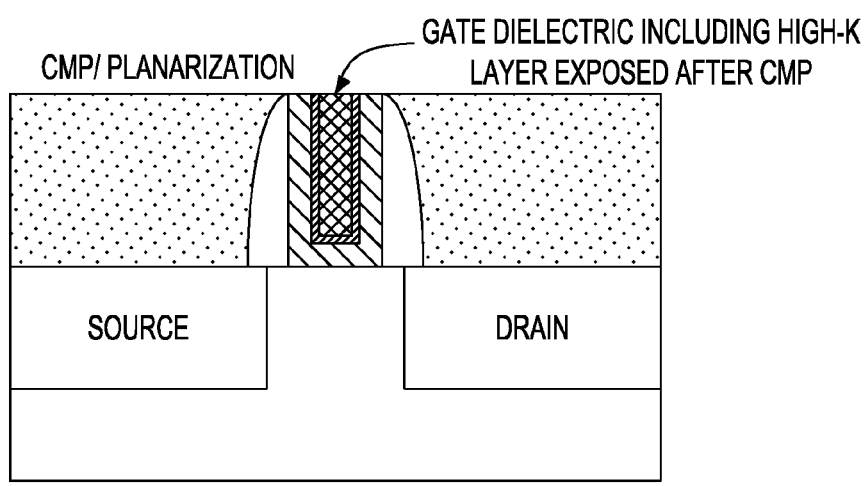
Figure 7:
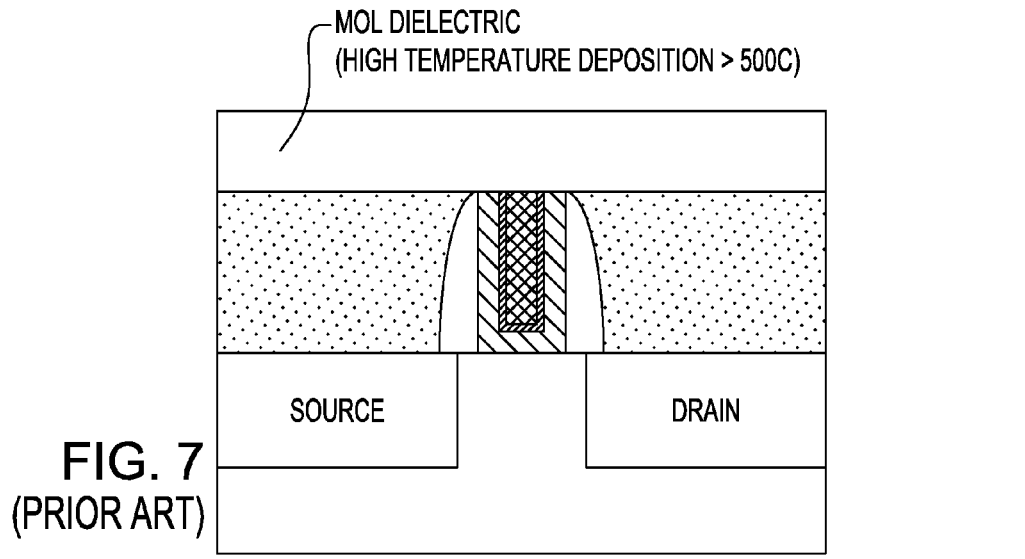
Figure 8:
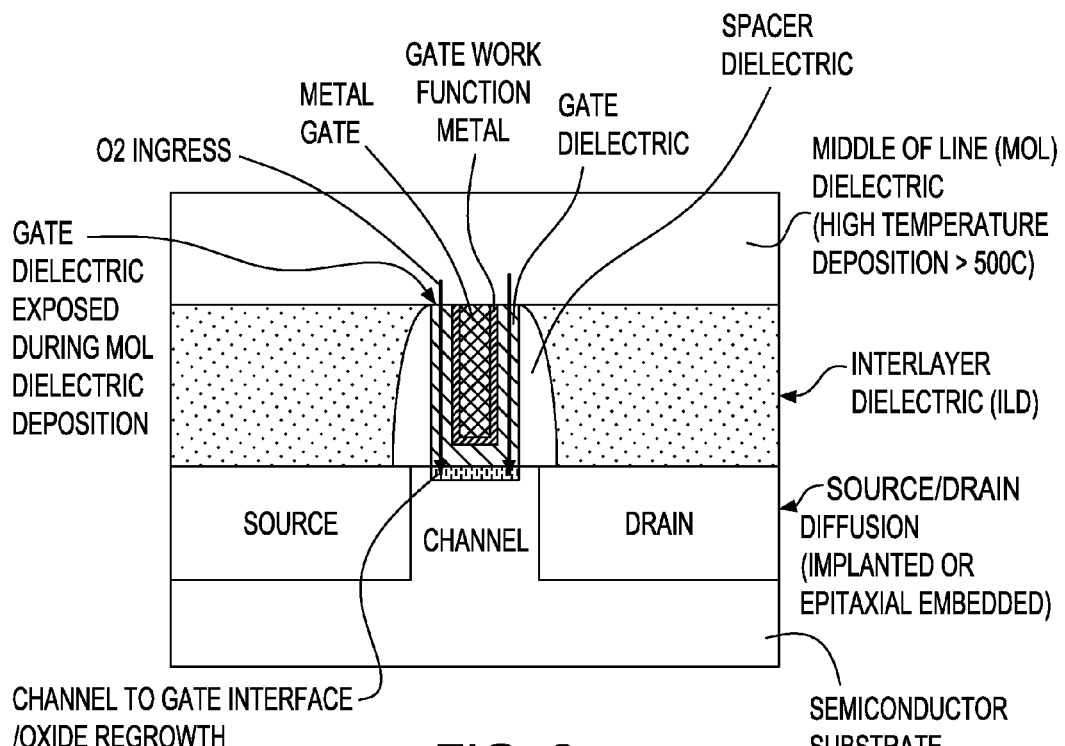

In one aspect, in an embodiment of the invention, a structure and a method of fabrication thereof are provided that effectively suppress the oxide regrowth issue associated with a typical HKMG RMG flow.

In another aspect, in an embodiment, a standard replacement metal gate (RMG) flow, the top periphery of high-K gate dielectric is exposed after the metal gate CMP step. Since high-K gate dielectric materials such as $HfO_2$ and hafnium silicates transport oxygen effectively, the exposed high-K periphery region serves as a conduit for oxygen found in subsequent high temperature process steps to reach the gate dielectric/channel interface, causing an unwanted regrowth of the gate dielectric interface region.

In yet another aspect, in an embodiment, an additional low temperature (<500° C.) silicon nitride layer is added immediately after the metal gate CMP step in order to seal the top surface of the wafer and the high-K periphery to block oxygen ingress and interface regrowth. By using a low temperature (<500° C.) silicon nitride deposition process, an undesired regrowth issue is avoided both during the deposition process itself and in subsequent processings since silicon nitride is an excellent barrier to oxygen diffusion. After the low temperature deposited silicon nitride is in place, the FET will be resistant to the regrowth issue even when high temperature processes greater than 500° C. are used.

In a further aspect, in order to suppress the oxygen ingress and resulting interface regrowth, the following structure can be provided: Immediately after gate metal polish in RMG, a first deposit a thin silicon nitride layer 3 to 5 nm thickness, deposited at a low temperature (<500° C.) providing a buffer layer to suppress oxygen ingress and interface regrowth. Subsequently, a second silicon nitride layer is deposited, which is deposited at higher temperatures (>500° C.) since the first nitride layer is already present and will block oxygen from entering the high-K gate dielectric. A second silicon nitride layer can be optimized for other properties, such as low dielectric constant to reduce the parasitic capacitance or higher density without any concern of oxygen ingress into the high-K dielectric. The first low temperature silicon nitride beneath already protects the gate dielectric stack from oxygen ingress, In order to suppress the oxygen ingress and a resulting interface regrowth, the structure is provided immediately after gate metal polish in RMG by first forming a high-K gate dielectric recess, and then depositing a thin silicon nitride layer preferably having a 3 to 5 nm thickness, deposited at low temperature (<500° C.) as a buffer layer to suppress an oxygen ingress and an interface regrowth. The silicon nitride fills the previously etched recess, thus forming a silicon nitride plug forming a significantly robust barrier to oxygen ingress. Subsequently a second silicon nitride layer is deposited, which can be deposited at higher temperatures (>500° C.) because the first nitride layer is already present and will block oxygen from entering the high-K gate dielectric. The second silicon nitride layer can be optimized for other properties such as a low dielectric constant to reduce parasitic capacitance or higher density, without concern of oxygen ingress into the high-K dielectric because the first low temperature silicon nitride beneath is already protecting the gate dielectric stack from oxygen ingress.

In an embodiment, an integrated semiconductor structure a field effect transistor (FET) having a metal gate adjacent to an interlayer dielectric (ILD) on top of a source and drain, the metal gate surrounded by a gate work function metal surrounding a gate dielectric and abutting to a sidewall spacer, and a silicon nitride oxygen blocking layer above a planarized top surface of the metal gate and spanning across the gate dielectric, and the ILD.

A method of forming an integrated semiconductor structure comprising providing a field effect transistor (FET) having a metal gate adjacent to an interlayer dielectric (ILD) on top of a source and a drain, the metal gate surrounded by a gate work function metal surrounding a gate dielectric and abutting at a sidewall spacer; and depositing at a low temperature a silicon nitride ($Si_3N_4$) oxygen blocking layer on top of a planarized surface of the metal gate, the deposition spanning across the gate dielectric and the ILD.

DETAILED DESCRIPTION

Figure 9:
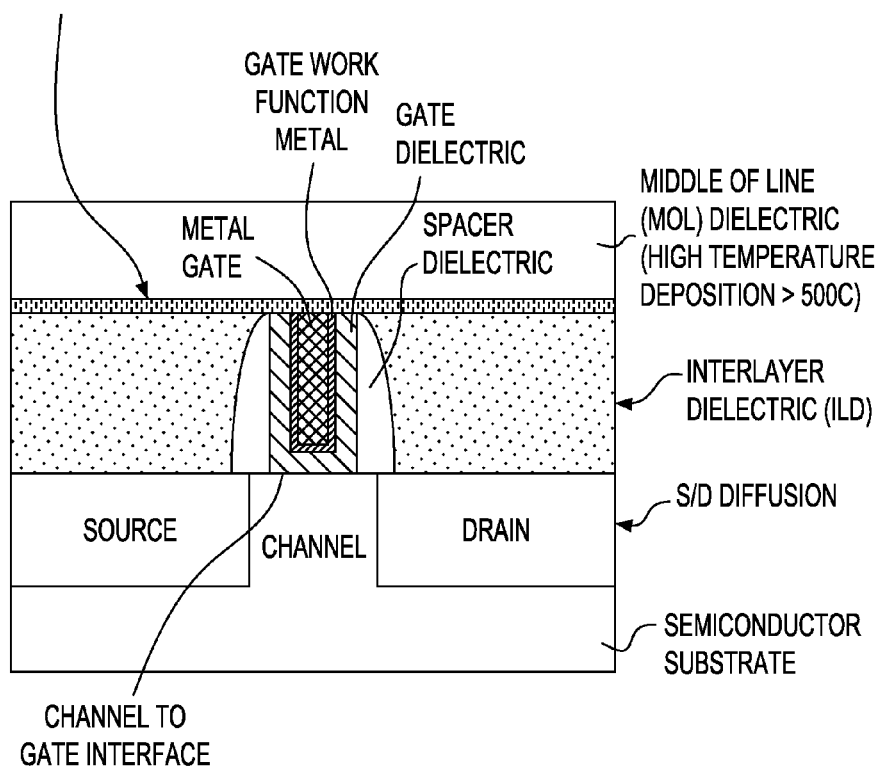
FIG. 9 shows an embodiment which blocks the oxygen ingress and diffusion to the high-K gate dielectric interface and channel region by the introduction of a silicon nitride $Si_3N_4$ buffer layer deposited at a low temperature, i.e., less than 500° C., according to an embodiment of the invention.

The accompanying drawings, which are incorporated in and which constitute part of the specification, illustrate the presently preferred embodiments of the invention which, together with the general description given above and the detailed description of the preferred embodiments given below serve to explain the principles of the disclosure FIG. 9 describes embodiments showing aspects of the inventive processes and structures. A silicon nitride buffer layer is deposited at low temperature (less than 500° C.) after the CMP process, but before the standard MOL dielectric deposition. Hence, as shown, the low temperature nitride layer is located between the gate which is below the nitride layer, and the MOL dielectric which is above the nitride layer. Because the additional silicon nitride buffer layer is deposited at a low temperature of 500° C. or less, oxygen ingress and diffusion into the high-K dielectric layer is effectively suppressed. Furthermore, once the top periphery of the high-K dielectric can be sealed by an additional low temperature silicon nitride layer, wherein a subsequent processing above 500° C. will not induce oxygen ingress into the high-K gate dielectric to semiconductor channel interface, particularly since silicon nitride is a highly effective barrier to oxygen diffusion. The silicon nitride layer can be deposited by molecular layer deposition (MLD), atomic layer deposition (ALD), CVD, or plasma-enhanced deposition, using precursors such as, but not limited to ammonia ($NH_3$), silane ($SiH_4$), tetrachlorosilane ($SiCl_4$), or dichlorosiline ($SiH_2Cl_2$) at a temperature of 500° C. or less. Thus, oxide regrowth can be effectively suppressed during the SiNx buffer layer formation.

In an embodiment, the low-temperature silicon nitride deposition is an MLD process preferably performed by heating the wafer at a temperature ranging between 400° C. and 500° C., alternately flowing an $NH_3$ remote plasma to provide nitrogen on the wafer surface. Next, a purge using $N_2$ flow removes the $NH_3$ from the gas phase, and a flow of $SiH_2Cl_2$ provides the silicon at the wafer surface. The two precursors react at the wafer surface and deposit a single molecular layer of silicon nitride. The cycle is repeated as many times as necessitated to reach the desired thickness of the silicon nitride, with an additional $N_2$ purge flow between each cycle to ensure that the $NH_3$ and $SiH_2Cl_2$ do not react in the gas phase to avoid a silicon nitride particle formation. In this manner, silicon nitride is only to be deposited at the wafer surface.

The thickness of the low-temperature silicon nitride layer can be any thickness required to be compatible with the semiconductor manufacturing flow, preferably 3 to 5 nm thick. On top of the low-temperature silicon nitride layer, a number of additional layers can be deposited including higher-temperature silicon nitride layers deposited at a temperature greater than 500° C., without concern of oxygen ingress and high-K gate dielectric interface regrowth at the semiconductor channel, because the underlying low-temperature silicon nitride layer is highly effective at blocking the oxygen. The ability to deposit higher-temperature silicon nitrides without inducing unwanted gate dielectric interface regrowth is desirable because higher-temperature silicon nitrides can have beneficial properties such as higher density, improved the mechanical properties or improved the barrier properties to avoid contamination.

Figure 10:
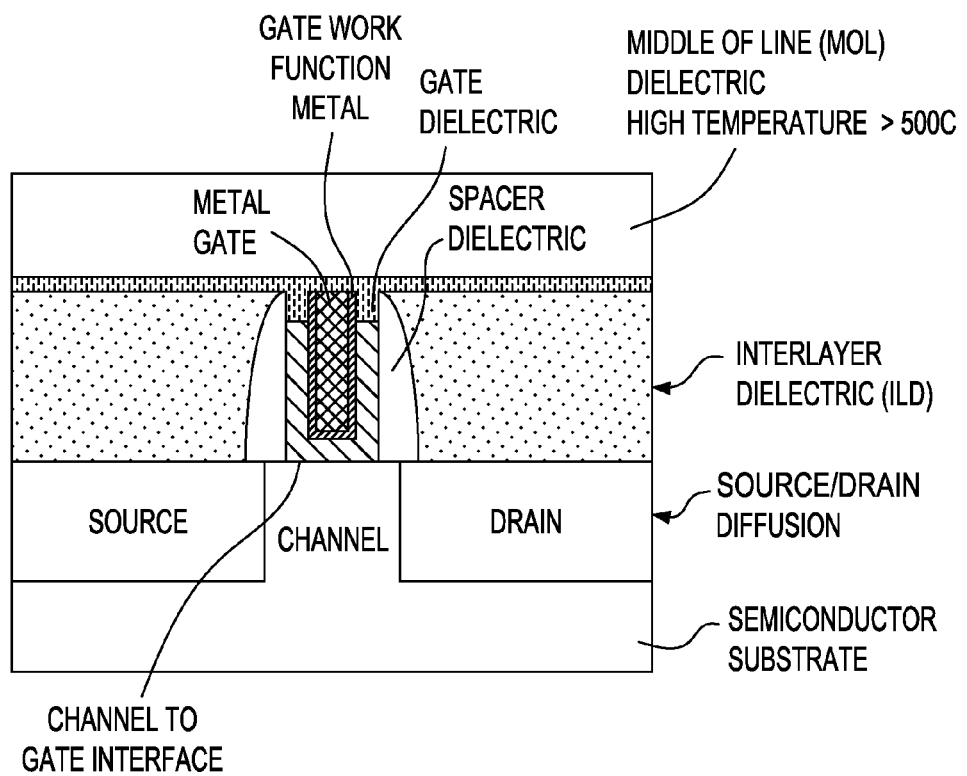
FIG. 10 shows an embodiment wherein before to the low-temperature silicon nitride layer deposition, a recess in the high-K gate dielectric is formed to allow the formation of a silicon nitride plug, in accordance with the embodiment of the invention.

FIG. 10 shows an additional inventive process and structure. In this case, before the low temperature silicon nitride deposition, the exposed high-K gate dielectric after CMP is selectively etched by either a wet or plasma-based chemistry to recess the high-K gate dielectric 2 to 10 nm lower than the other materials, although other recess depths can be contemplated as well. In an embodiment, a wet or plasma-based chemistry is used to etch the high-K gate dielectric layer significantly faster than other exposed materials such that a recess in the high-K is efficiently formed without a significant loss of other materials. Thereafter, the same low temperature silicon nitride deposition at a temperature 500° C. or less, as previously described, is used to seal that recess region, as well as the top surface of the wafer. Generally, the oxygen ingress is present at the aforementioned temperature. It is by way of the oxide regrowth that the problem can be effectively suppressed by a silicon nitride layer formation that further avoids the oxygen ingress through the gate High-K dielectric.

Still referring to FIG. 10, the recess allows the formation of a silicon nitride plug even more effective at blocking oxygen diffusion and ingress into the high-K gate dielectric to channel interface regions. On top of the low-temperature silicon nitride layer, additional layers can be deposited, including higher-temperature silicon nitride layers deposited at a temperature greater than 500° C., without concern of oxygen ingress and high-K gate dielectric interface regrowth at the semiconductor channel, because the underlying low-temperature silicon nitride layer is highly effective at blocking oxygen. The ability to deposit higher-temperature silicon nitrides without inducing unwanted gate dielectric interface regrowth is desirable because higher-temperature silicon nitrides can have beneficial properties such as higher density, improved mechanical properties, or improved barrier properties to avoid contamination.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention is not to be limited to the exact forms and details described and illustrated, but fall within the scope of the appended claims.

What is claimed is:

1. An integrated semiconductor structure comprising:
a field effect transistor (FET) having a metal gate adjacent to an interlayer dielectric (ILD) on top of a source and drain, the metal gate surrounded by a gate work function metal, the gate work function metal surrounded by a gate dielectric and the gate dielectric abutting to a sidewall spacer,
an oxygen blocking layer above a planarized top surface of the metal gate and spanning across the gate dielectric, the ILD, the entire source and the entire drain, wherein the work function metal and the metal gate each have a top and wherein the gate dielectric further comprising a recess to a level below the top of the work function metal and below the top of the metal gate, the oxygen blocking layer fills the entire recess, and wherein the gate dielectric and the oxygen blocking layer comprise different materials, and a dielectric layer directly over the oxygen blocking layer, the gate dielectric and the ILD, the dielectric layer only in direct contact with the oxygen blocking layer.

2. The integrated semiconductor structure of claim 1, wherein the gate dielectric layer comprises a plurality of layers and wherein the gate dielectric is made of a high-K dielectric material including hafnium oxide (HfO2), hafnium silicate (HfSixOy), zirconium oxide (ZrO2), zirconium silicate (ZrSixOy), or aluminum oxide (Al2O3).

3. The integrated semiconductor structure of claim 1 wherein the workfunction metal layer is made of a material selected from Titanium-Nitride (TiN), Titanium (Ti), Tantalum-Nitride (TaN) or Titanium-Carbide (TiC).

4. The integrated semiconductor structure of claim 1, wherein the metal gate is made of a tungsten (W) or aluminum (Al) material.

5. The integrated semiconductor structure of claim 1 wherein multiple FETs comprise both NFET with n-type source and drain regions, and PFET with p-type source and drain regions.

6. The integrated semiconductor structure of claim 1 wherein the FET is a finFET.

7. The integrated semiconductor structure of claim 1 further comprises the oxygen blocking layer of one or multiple silicon nitride layers.

8. The integrated semiconductor structure of claim 7, wherein high-temperature deposited silicon nitride layers are superimposed on top of a deposited low-temperature silicon nitride layer.

9. The integrated semiconductor structure of claim 7 wherein the high-temperature of the deposited silicon nitride layers exceeds a temperature of 500° C. and the low-temperature of the silicon nitride layer is below 500° C.

10. A method of forming an integrated semiconductor structure comprising:

providing a field effect transistor (FET) having a metal gate adjacent to an interlayer dielectric (ILD) on top of a source and a drain, the metal gate surrounded by a gate work function metal, the gate work function metal surrounded by a gate dielectric and the gate dielectric abutting at a sidewall spacer;

depositing an oxygen blocking layer on top of a planarized surface of the metal gate, the deposition spanning across the gate dielectric, the ILD, the entire source and the entire drain wherein the work function metal and the metal gate each have a top and wherein the gate dielectric further comprising a recess to a level below the top of the work function metal and below the top of the metal gate, the oxygen blocking layer fills the entire recess, and wherein the gate dielectric and the oxygen blocking layer comprise different materials; and depositing a dielectric layer directly over the oxygen blocking layer, the gate dielectric and the ILD, the dielectric layer only in direct contact with the oxygen blocking layer.

11. The method as recited in claim 10 depositing a buffer layer on top of the metal gate, wherein the gate dielectric recess forms a first oxygen blocking plug.

12. The method as recited in claim 10 wherein the oxygen blocking layer comprises one or multiple silicon nitride layers.

13. The method as recited in claim 12 wherein the silicon nitride layers further comprise depositing a second silicon nitride layer on top of the low-temperature silicon nitride buffer layer.

14. The silicon nitride layers of claim 12 wherein the low temperature silicon nitride buffer layer is deposited at a temperature below 500° C.

15. The silicon nitride layers of claim 12, wherein prior to the low-temperature silicon nitride layer deposition a recess in the high-K gate dielectric comprises forming a silicon nitride plug.

16. The silicon nitride layers of claim 12 wherein the low temperature silicon nitride buffer layer is deposited using NH3 and SiH2Cl2 at a temperature below 500° C.

17. The silicon nitride layers of claim 12 further comprising depositing the low temperature silicon nitride layer by molecular layer deposition (MLD).

18. The method as recited in claim 17, wherein depositing the silicon nitride layer is performed by one molecular layer at a time, alternately flowing NH3 and SiH2Cl2.

19. The method as recited in claim 18 wherein the depositing the low temperature silicon nitride layer by molecular layer deposition (MLD) further comprises depositing the silicon nitride layer one molecular layer at a time, alternately flowing NH3 plasma and SiH2Cl2.

20. An integrated semiconductor structure comprising:

a field effect transistor (FET) having a metal gate adjacent to an interlayer dielectric (ILD) on top of a source and drain, the metal gate surrounded by a gate work function metal, the gate work function metal surrounded by a gate dielectric and the gate dielectric abutting to a sidewall spacer, the work function metal and the metal gate each have a top, a recess in the gate dielectric to a level below the top of the work function metal and below the top of the metal gate, and an oxygen blocking layer above a planarized top surface of the metal gate and that fills the entire recess, the oxygen blocking layer spanning across the gate dielectric, and the ILD, wherein the gate dielectric and the oxygen blocking layer comprise different materials.

* * * * *